United States Patent
Lee et al.

(10) Patent No.: US 7,115,840 B2
(45) Date of Patent: Oct. 3, 2006

(54) WAFER BAKE APPARATUS

(75) Inventors: Dong-woo Lee, Seoul (KR); Jin-sung Lee, Seoul (KR); Jong-kill Lim, Hwaseong-si (KR); Bang-weon Lee, Seoul (KR); Tae-sang Park, Suwon-si (KR); Tae-gyu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/206,842

(22) Filed: Aug. 19, 2005

(65) Prior Publication Data

US 2006/0049168 A1  Mar. 9, 2006

(30) Foreign Application Priority Data

Aug. 20, 2004 (KR) ............... 10-2004-0065875

(51) Int. Cl.
*H05B 3/68* (2006.01)
*C23C 16/00* (2006.01)

(52) U.S. Cl. ................... 219/444.1; 118/724

(58) Field of Classification Search ........... 219/443.1, 219/444.1, 390; 118/724, 721; 432/221, 432/253
See application file for complete search history.

(56) References Cited

U.S. PATENT DOCUMENTS

| | | | |
|---|---|---|---|
| 5,834,737 A * | 11/1998 | Hirose et al. | 219/385 |
| 6,129,546 A * | 10/2000 | Sada | 432/253 |
| 6,969,829 B1 * | 11/2005 | Tsuruno et al. | 219/390 |

* cited by examiner

*Primary Examiner*—Sang Paik
(74) *Attorney, Agent, or Firm*—Sughrue Mion, PLLC

(57) ABSTRACT

A wafer bake apparatus includes an air flow control unit of pneumatic cylinder structure operating interlockingly with a wafer lift unit and induces the air flow between a wafer and a hot plate. Therefore, when a wafer is placed in a baking position the air between the wafer and the hot plate descends. As a result, the wafer is no longer under the influence of air resistance, and can be more accurately placed in the baking position. In addition, when the baked wafer is lifted to an unloading position, the air between the hot plate and the wafer ascends, which in turn supports the wafer and prevents the distortion of the wafer.

9 Claims, 4 Drawing Sheets

WAFER BAKE APPARATUS

CROSS-REFERENCE TO RELATED APPLICATIONS

This application claims benefit under 35 U.S.C. § 119 from Korean Patent Application No. 2004-65875, filed on Aug. 20, 2004, the entire content of which is incorporated herein by reference.

BACKGROUND OF THE INVENTION

1. Field of the Invention

The present invention relates to a wafer bake apparatus.

2. Description of the Related Art

In general, a wafer bake apparatus is used to volatilize the solvent of a photoresist coating on a wafer.

Semiconductor fabrication is largely divided into cleaning, heat treatment, impurity implantation, thin film formation, lithography, and planarization processes. Particularly, the lithography process consists of many steps: exposing a pattern, developing, etching, and photoresist removing. As for the exposing a pattern, a desired pattern on a mask substrate or reticle is projected onto the surface of a wafer at a reduction ratio. In fact, this process is a vital technique of all the processes and requires the most expensive equipment available. Once the pattern is formed, an etching process is performed using the photoresist pattern as a mask.

Before coating the photoresist for forming a pattern on the wafer, the surface of the wafer should be dry. In order to remove water (moisture) from the surface of the wafer, the wafer is usually heated at a predetermined temperature. FIG. 1 is a schematic view of a related art wafer bake apparatus for heating a wafer at a predetermined temperature.

As shown in FIG. 1, the wafer bake apparatus includes a process chamber 1, a hot plate 2, and a wafer lift unit 3 for moving a wafer W to a baking position and an unloading position. The wafer W is placed on a plurality of proximities 4 disposed on the hot plate 2. The process chamber 1 has a cover 5, and the wafer lift unit 3 has lift pins 3a to be inserted into a plurality of through holes 2a that are formed in the hot plate 2.

In the wafer bake apparatus, the wafer W is usually lifted by a robot (not shown) onto the lift pins 3a protruded upwards from the hot plate 2. Then, as the wafer lift unit 3 descends the wafer W is placed on the baking position, i.e., on the proximities 4 of the hot plate 2, to be baked (please refer to FIG. 2).

When the baking is complete the wafer W is moved to the unloading position as shown in FIG. 3 by means of the lift pins 3a which ascend by the wafer lift unit 3. Then the robot (not shown) unloads the wafer W from the unloading position.

However, the related art wafer bake apparatus has defects. For instance, as the size of the wafer increases and the separation distance (or gap) between the hot plate 2 and the wafer W is maintained less than 100 μm, air resistance from outside negatively affects the wafer delivery performance by the wafer lift unit 3. As a result, the wafer W is not properly carried and is often damaged.

As FIG. 2 illustrates, sometimes the wafer W is not properly placed at the baking position due to the air resistance between the hot plate 2 and the wafer W. Also, as FIG. 3 illustrates, when the baked wafer W is moved to the unloading position the wafer W can be distorted due to air resistance above the wafer W.

SUMMARY OF THE INVENTION

It is, therefore, an aspect of the present invention to provide a wafer bake apparatus capable of preventing the position displacement and transformation of a wafer caused by the surrounding air resistance, which is made possible through the adjustment of air flow around the wafer.

To achieve the above aspects and advantages, there is provided a wafer bake apparatus, including: a process chamber; a hot plate installed inside the process chamber and having a plurality of vertical through-holes formed at predetermined positions; a wafer lift unit for moving a wafer to a baking position in the vicinity of the hot plate and an unloading position separated from the hot plate; and an air flow control unit inducing an air flow for reducing air resistance surrounding the wafer when the wafer ascends/descends by operation of the wafer lift unit.

The air flow control unit includes at least one cylinder having a predetermined volume and passing through predetermined position(s) of the hot plate in a vertical direction; and a piston moving along the cylinder in a vertical direction for controlling the air flow between the hot plate and the wafer.

The piston may move in the vertical direction interlockingly with the operation of the wafer lift unit.

The piston may also be connected to the wafer lift unit as one body.

Also, a highest rising position and a lowest falling position of the piston may be located in the cylinder.

According to an exemplary embodiment of the present invention the process chamber includes an openable cover. The wafer baking position is separated from the hot plate by 70–100 μm, and the hot plate includes a plurality of proximities for maintaining the separation distance of 70–100 μm. In addition, the wafer lift unit includes a plurality of lift pins arranged vertically movably in the through-holes formed in the hot plate. In the present invention, the air flow control unit of pneumatic cylinder structure operates interlockingly with the wafer lift unit and induces the air flow between the wafer and the hot plate. Therefore, the wafer can be more accurately placed at the baking position, and is less distorted or twisted when it is lifted to the unloading position.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE ILLUSTRATIVE, NON-LIMITING EMBODIMENTS OF THE INVENTION

An exemplary embodiment of the present invention will be described herein below with reference to the accompanying drawings.

Figure 1:
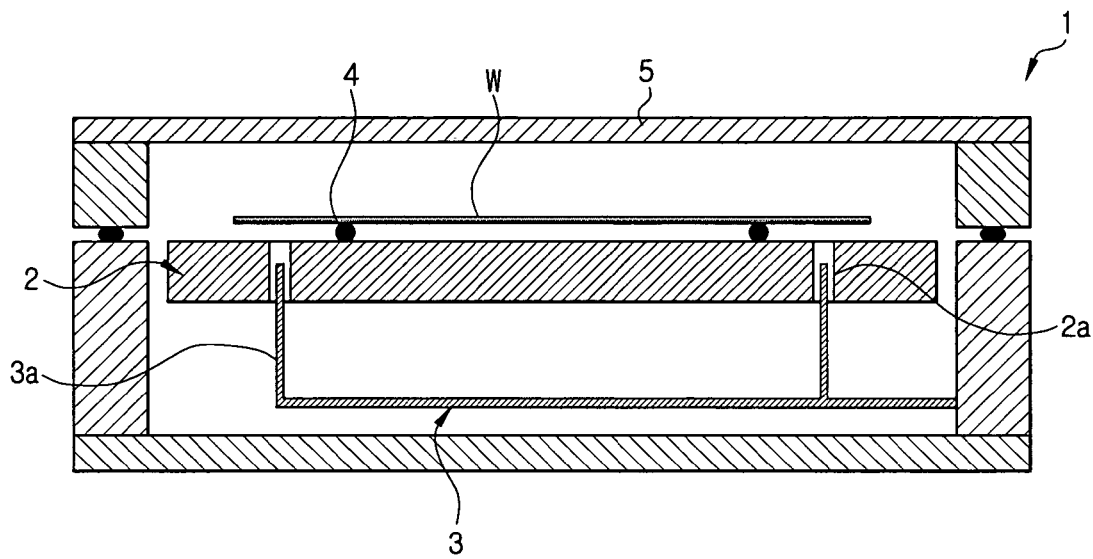
FIG. 1 is a schematic view of a related art wafer bake apparatus.
Figure 2:
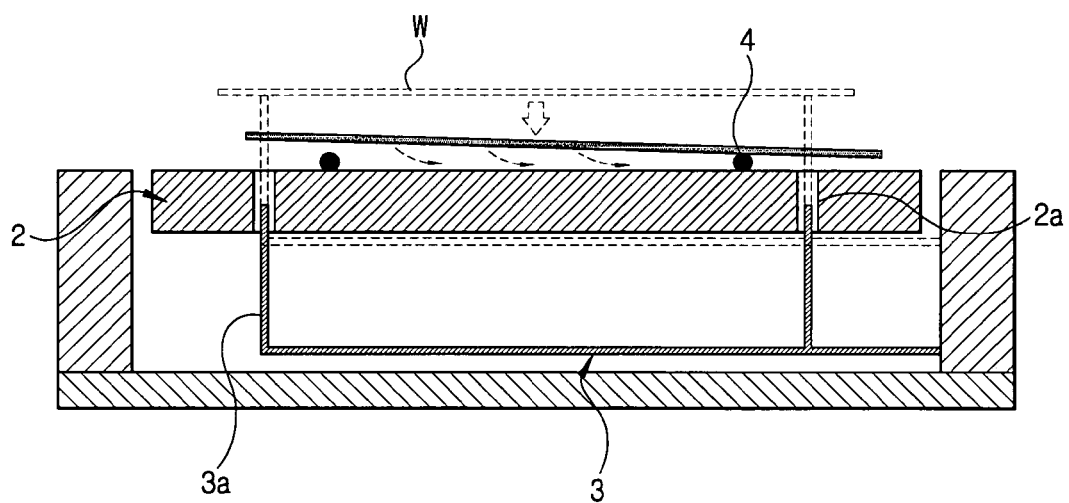
FIG. 2 illustrates a case where a wafer for use in the wafer bake apparatus of FIG. 1 is placed at a baking position.
Figure 3:
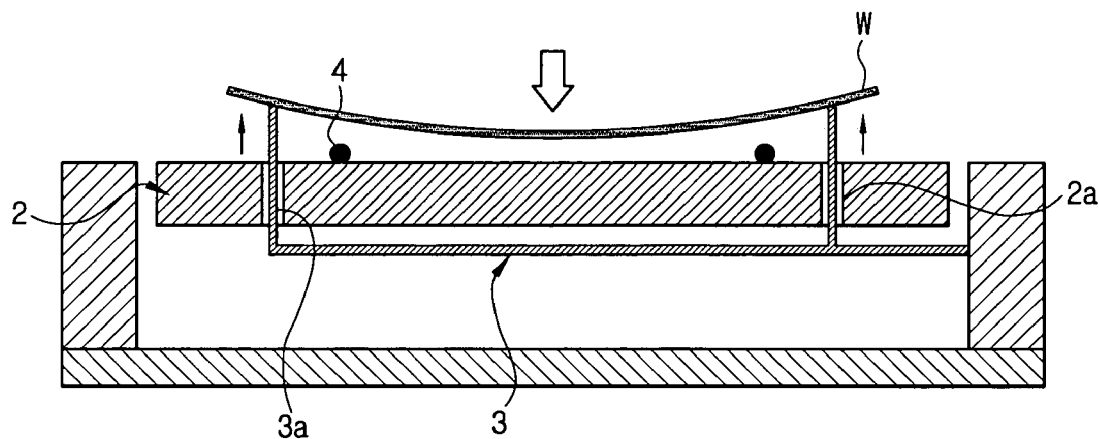
FIG. 3 illustrates a case where a baked wafer of FIG. 2 is moved to an unloading position.
Figure 4:
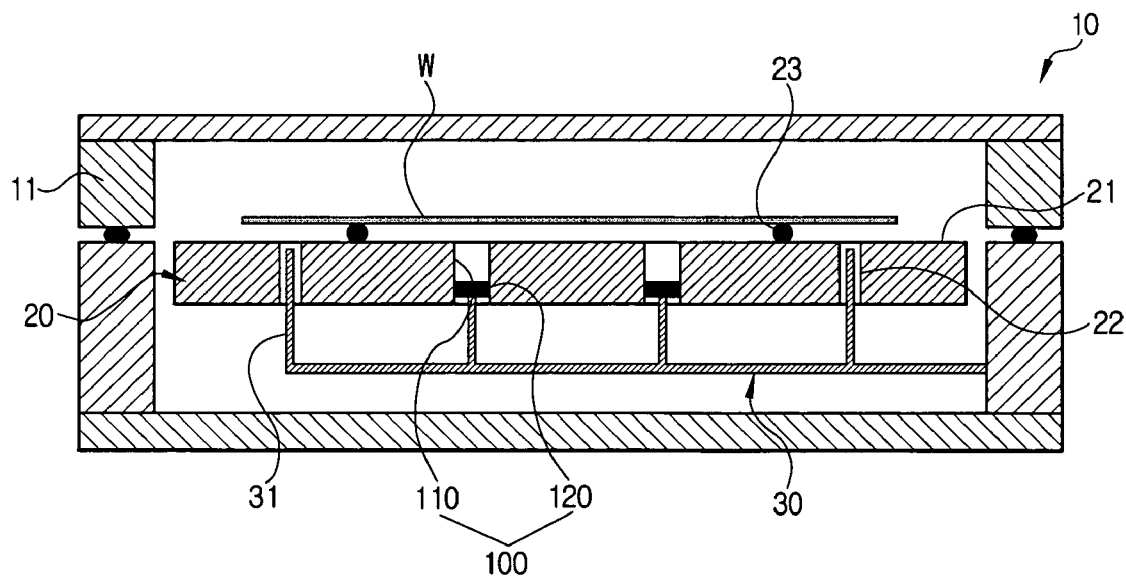
FIG. 4 is a schematic view of a wafer bake apparatus according to one embodiment of the present invention.

FIG. 4 is a schematic view illustrating a wafer bake apparatus consistent with the present invention.

As shown in FIG. 4, the wafer bake apparatus includes a process chamber 10, a hot plate 20, a wafer lift unit 30, and air flow control units 100.

The process chamber 10 includes an openable cover 11, and creates an atmosphere for a baking process, that is, the process chamber 10 is tightly closed to prevent the emission of heat to outside.

The hot plate 20 is installed inside the process chamber 10, and a plurality of vertical through-holes 22 are formed at predetermined positions of the hot plate. A plurality of heating mediums are built in the hot plate 20, and a plurality of proximities 23 are disposed on an upper surface 21 of the hot plate 20 in order to ensure that the wafer W is accurately positioned at a baking position. The baking position is separated from the hot plate 20 by 70–100 µm.

The wafer lift unit 30 moves the wafer W to the baking position in the vicinity of the hot plate 20, and to the unloading position separated from the hot plate 20, and includes lift pins 31 that are inserted into the through-holes 22.

Each of the air flow control units 100 includes a cylinder 110 and a piston 120.

The cylinders 110, each having a predetermined volume, pass through predetermined positions on the hot plate 20. According to an exemplary embodiment of the present invention, the cylinders 110 are located closer to the center (that is, the inner portion) of the hot plate 20, and spaced apart by a predetermined distance.

Figure 5:
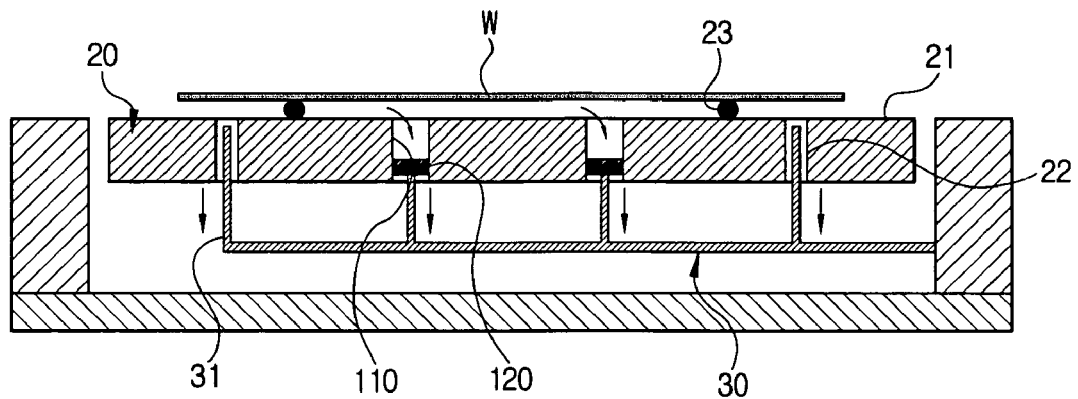
FIG. 5 illustrates a case where a wafer for use in the wafer bake apparatus of FIG. 4 is placed at a baking position.
Figure 6:
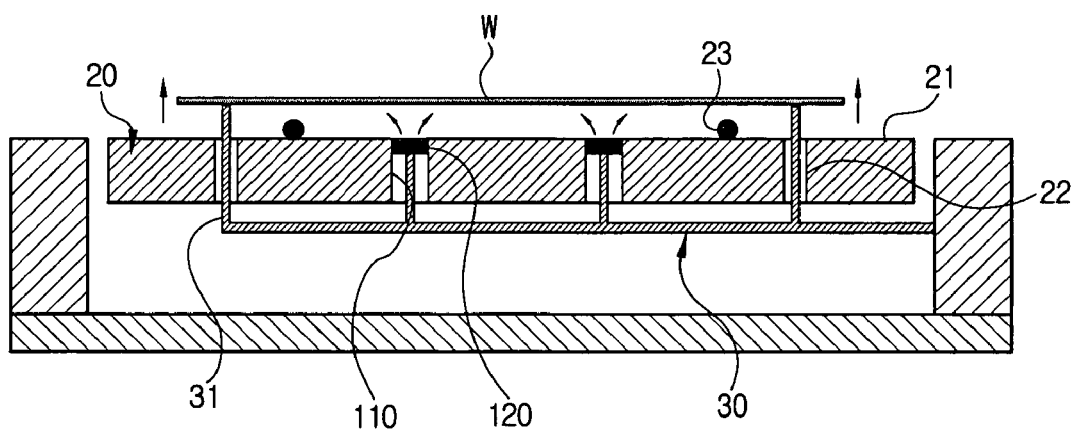
FIG. 6 illustrates a case where a baked wafer of FIG. 5 is moved to an unloading position.
Figure 7:
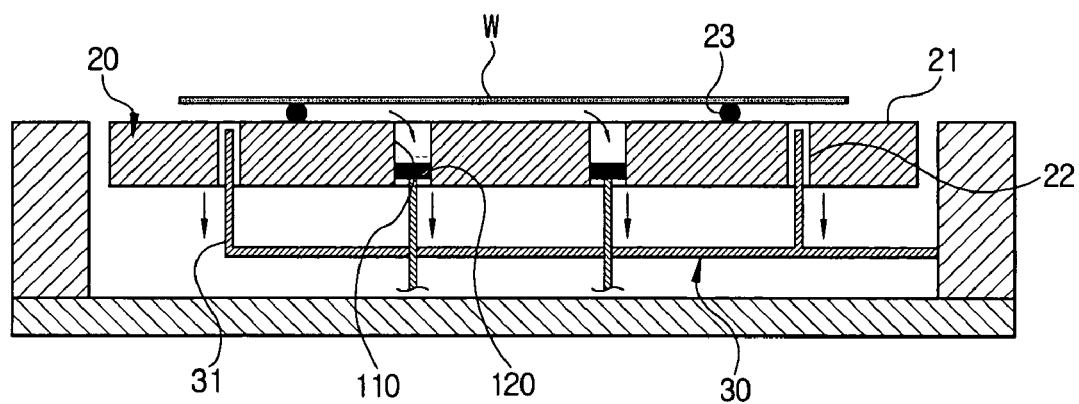
FIG. 7 illustrates a case where a wafer for use in a wafer bake apparatus according to another embodiment of present invention is placed at a baking position.
Figure 8:
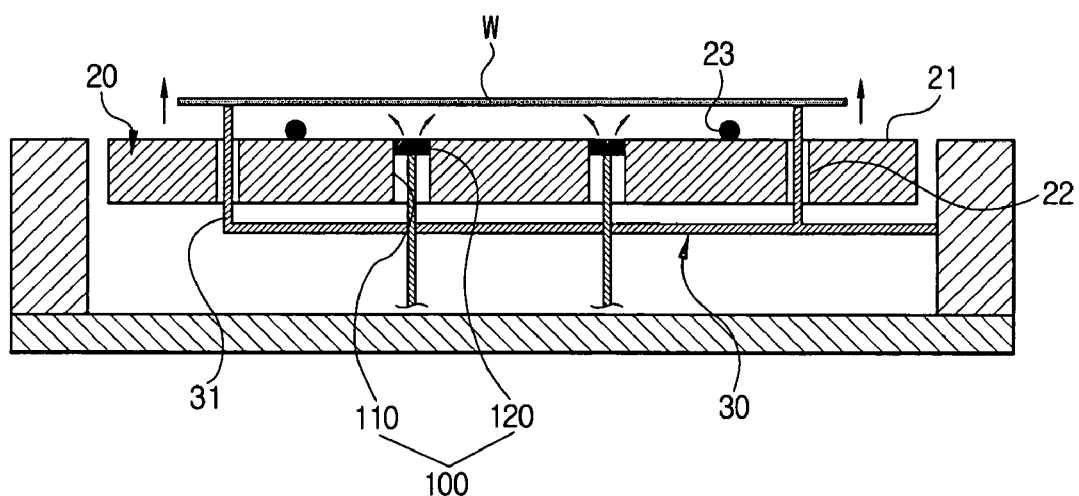
FIG. 8 illustrates a case where a baked wafer of FIG. 7 is moved to an unloading position.

The piston 120 moves along the cylinder 110 in the vertical direction, and controls the air flow between the hot plate 20 and the wafer W. The piston 120 operates interlockingly with the wafer lift unit 30 in the vertical direction. The piston 120 can be connected to the wafer lift unit 30 as illustrated in FIG. 5 and FIG. 6, or it can be built separately from the wafer lift unit 30 as illustrated in FIG. 7 and FIG. 8.

Preferably, the highest rising position and the lowest falling position of the piston 120 are located within the cylinder 110. In other words, the highest rising position of the piston 120 should not be over the upper surface of the hot plate 20, and the lowest falling position of the piston 120 should not be below the lower surface of the hot plate 20.

The following description will now explain the operation of the wafer bake apparatus, with reference to FIGS. 4 to 8.

Whenever a wafer W is fabricated, it is necessary to heat the wafer W at a high temperature to make sure that the water (moisture) that might still remain on the wafer out of the fabrication process can be removed completely. To this end, a robot (not shown) takes the wafer W and carries it into the process chamber 10 whose cover (11 of FIG. 4) is opened.

As shown in FIG. 5, the wafer W delivered by the robot is placed in the process chamber 10, more specifically, on the lift pins 31 that are protruded to a predetermined height from the hot plate 20. Then, the wafer W on the lift pins 31 descends along the lift pins 31 until it is placed right on the proximities 23 disposed on the upper surface 21 of the hot plate 20. When the wafer W descends, air between the wafer W and the hot plate 20 is pushed out. Here, the air is actually drawn into the cylinder 110 by the descending piston 120 inside the cylinder 110. Therefore, when the wafer W moves to the baking position no air resistance is applied to the wafer W, whereby the wafer's positioning error does not occur.

As the air is sucked into the cylinder by the descending piston 120, the air pressure between the wafer W and the hot plate 20 becomes lower than the air pressure above the wafer W, so the air above the wafer W presses down the wafer W. Since the wafer W is closely adhered to the lift pins 31 during its descending, it can be accurately placed on the designated baking position on the relevant proximities 23.

When the wafer baking is over, the lift pins 31 ascend as shown in FIG. 6, and the wafer W is lifted to the unloading position. At this time, the piston 120 operates interlockingly with the wafer lift unit 30, ascending together. Then, the air inside the cylinder 110 is exhausted by the piston 120 and presses upwardly on the central part of the wafer W.

The pressure that is applied to the central part of the wafer W corresponds to the air resistance over the wafer W during its ascending through the lift pins 31. Therefore, it becomes possible to prevent the distortion of the wafer W caused by the air resistance.

FIG. 7 and FIG. 8 illustrate another embodiment of the present invention, showing that the piston 120 can be lifted separately from the wafer lift unit 30. The operational principles and effects thereof are same as before.

As described above, the air flow control unit of pneumatic cylinder structure operates interlockingly with the wafer lift unit and induces the air flow between the wafer and the hot plate. Therefore, the wafer can be more accurately placed on the baking position, and is less distorted or twisted when it is moved to the unloading position.

In conclusion, because there is a greatly reduced possibility of the process error and damage in the wafer according to the wafer bake apparatus of the present invention, the wafer yield can be improved.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A wafer bake apparatus, comprising:
   a process chamber;
   a hot plate installed inside the process chamber and having a plurality of vertical through-holes formed at predetermined positions;
   a wafer lift unit which moves a wafer to a baking position in the vicinity of the hot plate and an unloading position separated from the hot plate; and
   an air flow control unit which moves in conjunction with an operation of the wafer lift unit and which induces an air flow for reducing air resistance surrounding the wafer when the wafer ascends/descends by the operation of the wafer lift unit.

2. The apparatus according to claim 1, wherein the process chamber comprises an openable cover.

3. The apparatus according to claim 1, wherein the wafer baking position is separated from the hot plate by 70–100 µm, and the hot plate comprises a plurality of proximities for maintaining the separation distance of 70–100 µm.

4. The apparatus according to claim 1, wherein the wafer lift unit comprises a plurality of lift pins arranged vertically movably in the through-holes formed in the hot plate.

5. A wafer bake apparatus, comprising:
- a process chamber;
- a hot plate installed inside the process chamber and having a plurality of vertical through-holes formed at predetermined positions;
- a wafer lift unit which moves a wafer to a baking position in the vicinity of the hot plate and an unloading position separated from the hot plate;
- an air flow control unit which induces an air flow for reducing air resistance surrounding the wafer when the wafer ascends/descends by operation of the wafer lift unit; and
- wherein the air flow control unit comprises:
- at least one cylinder having a predetermined volume and passing through predetermined position(s) of the hot plate in a vertical direction; and
- a piston which moves along the cylinder in a vertical direction for controlling the air flow between the hot plate and the wafer.

6. The apparatus according to claim 5, wherein the piston moves in the vertical direction interlockingly with the operation of the wafer lift unit.

7. The apparatus according to claim 6, wherein the piston is connected to the wafer lift unit as one body.

8. The apparatus according to claim 6, wherein a highest rising position and a lowest falling position of the piston are located in the cylinder.

9. A wafer bake apparatus, comprising:
- a process chamber;
- a hot plate installed inside the process chamber and having a plurality of vertical through-holes formed at predetermined positions;
- a wafer lift unit which moves a wafer to a baking position in the vicinity of the hot plate and an unloading position separated from the hot plate; and
- means, which moves in conjunction with an operation of the wafer lift unit, for inducing an air flow for reducing air resistance surrounding the wafer when the wafer ascends/descends by the operation of the wafer lift unit.

* * * * *